US009355364B2

United States Patent
Miller et al.

(10) Patent No.: US 9,355,364 B2
(45) Date of Patent: May 31, 2016

(54) RECIPROCAL QUANTUM LOGIC COMPARATOR FOR QUBIT READOUT

(71) Applicants: Donald L. Miller, Export, PA (US); Ofer Naaman, Ellicott City, MD (US)

(72) Inventors: Donald L. Miller, Export, PA (US); Ofer Naaman, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 250 days.

(21) Appl. No.: 14/202,724

(22) Filed: Mar. 10, 2014

(65) Prior Publication Data

US 2015/0254571 A1    Sep. 10, 2015

(51) Int. Cl.
*H01L 23/48* (2006.01)
*G06N 99/00* (2010.01)
*H01L 39/22* (2006.01)
*H03K 3/38* (2006.01)

(52) U.S. Cl.
CPC ............ *G06N 99/002* (2013.01); *H01L 39/223* (2013.01); *H03K 3/38* (2013.01)

(58) Field of Classification Search
CPC ... H05K 3/38; H03K 19/195; H03K 19/1952; H03K 19/1954; H03K 19/1958
USPC .......................................................... 326/1–7
See application file for complete search history.

(56) References Cited

U.S. PATENT DOCUMENTS

| | | | | |
|---|---|---|---|---|
| 7,335,909 B2* | 2/2008 | Amin | ..................... | B82Y 10/00 257/30 |
| 7,724,020 B2* | 5/2010 | Herr | ....................... | B82Y 10/00 326/3 |
| 7,782,077 B2* | 8/2010 | Herr | ....................... | B82Y 10/00 326/4 |
| 8,022,722 B1* | 9/2011 | Pesetski | ................. | B82Y 10/00 326/3 |
| 8,489,163 B2* | 7/2013 | Herr | ......................... | H03K 3/38 505/190 |
| 2003/0016069 A1* | 1/2003 | Furuta | .................... | B82Y 10/00 327/367 |
| 2006/0290553 A1* | 12/2006 | Furuta | .................... | H03K 3/38 341/155 |
| 2010/0033206 A1* | 2/2010 | Herr et al. | ......................... | 326/4 |
| 2010/0164536 A1* | 7/2010 | Herr | ....................... | B82Y 10/00 326/4 |
| 2011/0241765 A1* | 10/2011 | Pesetski et al. | ............... | 327/528 |

* cited by examiner

*Primary Examiner* — Jason M Crawford
*Assistant Examiner* — Kurtis R Bahr
(74) *Attorney, Agent, or Firm* — Tarolli, Sundheim, Covell & Tummino LLP (57) ABSTRACT

One aspect of the present invention includes a reciprocal quantum logic (RQL) readout system. The system includes an input stage on which a read pulse is provided and an output stage configured to propagate an output pulse. The system also includes an RQL comparator comprising a first Josephson junction and a second Josephson junction that are coupled to a qubit. A bias current switches between a first Josephson junction in a first quantum state of the qubit and a second Josephson junction in a second quantum state of the qubit. The first Josephson junction triggers to provide the output pulse on the output stage in the first quantum state in response to the read pulse and the second Josephson junction triggers to provide no output pulse on the output stage in the second quantum state in response to the read pulse.

20 Claims, 3 Drawing Sheets

RECIPROCAL QUANTUM LOGIC COMPARATOR FOR QUBIT READOUT

This invention was made with Government support under Contract No. W911NF-11-C-0069, Project No. 36545. The Government has certain rights in this invention.

TECHNICAL FIELD

The present invention relates generally to quantum and classical digital superconducting circuits, and specifically to a reciprocal quantum logic (RQL) comparator for qubit readout.

BACKGROUND

Superconducting digital technology has provided computing and/or communications resources that benefit from unprecedented high speed, low power dissipation, and low operating temperature. A typical goal in the implementation of a superconducting circuit is very high-speed manipulation of data (e.g., tens of Gigahertz) in a manner that is very power efficient and minimizes losses through temperature. Superconducting technology can implement qubits to store quantum information. One example of a qubit is a phase qubit, which can be configured as an LC resonator, such as formed from an inductor shunting a Josephson junction. A control circuit can be employed to write to the phase qubit and a readout circuit can be employed to read a quantum state from the phase qubit.

SUMMARY

One aspect of the present invention includes a reciprocal quantum logic (RQL) readout system. The system includes an input stage on which a read pulse is provided and an output stage configured to propagate an output pulse. The system also includes an RQL comparator comprising a first Josephson junction and a second Josephson junction that are coupled to a qubit. A bias current switches between a first Josephson junction in a first quantum state of the qubit and a second Josephson junction in a second quantum state of the qubit. The first Josephson junction triggers to provide the output pulse on the output stage in the first quantum state in response to the read pulse and the second Josephson junction triggers to provide no output pulse on the output stage in the second quantum state in response to the read pulse.

Another aspect of the present invention includes a method for reading a quantum state of a phase qubit. The method includes providing a bias current through a first Josephson junction and a second Josephson junction in a first direction in a first quantum state of the phase qubit and in a second direction in a second quantum state of the phase qubit. The method also includes applying a read pulse at a first cycle of an RQL clock signal, the read pulse being propagated on an input stage to the first and second Josephson junctions. The method further includes determining whether the phase qubit is in the first quantum state based on receiving an output pulse at an output stage in response to the first Josephson junction triggering based on the bias current being provided in the first direction and the read pulse, or in the second quantum state based on not receiving output pulse at the output stage in response to the second Josephson junction triggering based on the bias current being provided in the second direction and the read pulse.

Another aspect of the present invention includes an RQL readout system. The system includes an RQL clock configured to generate an RQL clock signal and an input stage along which a read pulse is propagated via at least one input Josephson junction. The read pulse can be provided on a first cycle of the RQL clock signal. The system also includes an output stage configured to propagate an output pulse via at least one output Josephson junction during the first cycle of the RQL clock signal. The system further includes an RQL comparator that includes a first Josephson junction and a second Josephson junction that are inductively coupled to a phase qubit. A relative threshold associated with each of the first and second Josephson junctions changes in a first quantum state of the phase qubit relative to a second quantum state of the phase qubit to provide the output pulse on the output stage in the first quantum state in response to the read pulse and to provide no output pulse on the output stage in the second quantum state in response to the read pulse.

DETAILED DESCRIPTION

The present invention relates generally to quantum and classical digital superconducting circuits, and specifically to a reciprocal quantum logic (RQL) comparator for qubit readout. An RQL readout system can include an input stage on which a read pulse is provided. The input stage can include at least one input Josephson junction on which the read pulse can propagate. The read pulse can be provided, such as from an external RQL circuit, to determine a quantum state of a phase qubit. The RQL readout system can also include an output stage configured to propagate an output pulse in a first quantum state of the phase qubit in response to the read pulse. If the phase qubit is in the second quantum state, the output pulse is not provided on the output stage in response to the read pulse. The RQL readout system also includes an RQL comparator comprising a first Josephson junction and a second Josephson junction that are coupled to the phase qubit. The quantum state of the phase qubit can set a relative threshold associated with each of the first and second Josephson junctions. As an example, the phase qubit can be inductively coupled to the RQL comparator to provide a bias current flow in either a first direction or a second direction through the Josephson junctions depending on the quantum state of the phase qubit. Thus, one of the first and second Josephson junctions can trigger in response to the read pulse based on the bias current being either added to or subtracted from the read pulse based on the direction of current flow of the bias current through the first and second Josephson junctions, respectively, to either provide or not provide the output pulse on the output stage.

The RQL readout system also includes an RQL clock that provides RQL clock signal to each of the input stage, the output stage, and the RQL comparator. Because the phase qubit can be inductively coupled to the RQL comparator, the phase qubit can be effectively isolated from the RQL clock and the associated shunting resistors. As a result, the phase qubit is decoupled from potential noise sources to substantially prevent degradation of coherence time of the phase qubit. The RQL clock signal can affect the thresholds of the Josephson junctions in the input stage, the output stage, and the RQL comparator to facilitate triggering of the Josephson junctions, such that the read pulse can be provided at a first cycle (e.g., positive cycle) of the RQL clock signal. During a second cycle (e.g., negative cycle) of the RQL clock signal, a negative pulse can be provided to reset the respective Josephson junctions, thus allowing subsequent readout of the quantum state of the phase qubit.

Figure 1:
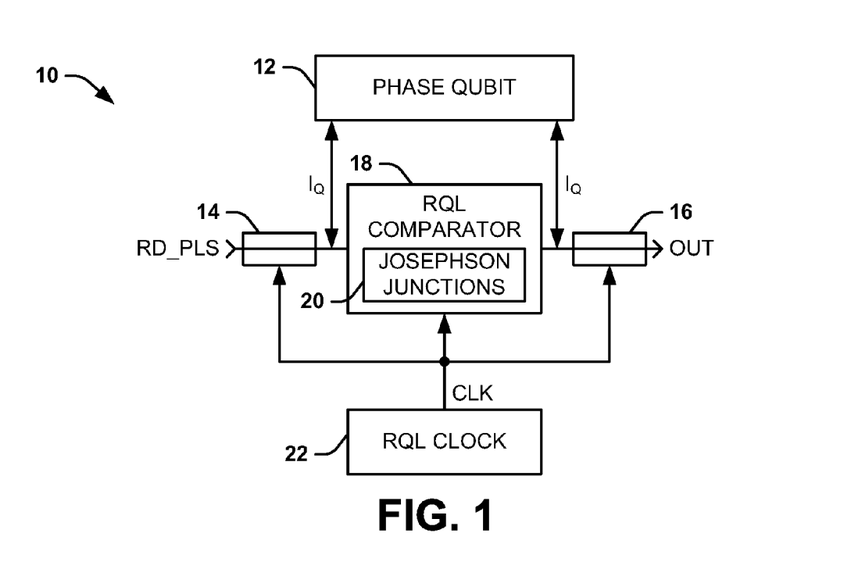
FIG. 1 illustrates an example of an RQL readout system.

FIG. 1 illustrates an example of an RQL readout system 10. The RQL readout system 10 can be implemented in a variety of quantum and classical computing environments to read a quantum state from a superconducting qubit 12. As an example, at least a portion of the RQL readout system 10 can be implemented on an integrated circuit (IC) in a superconducting environment. In the example of FIG. 1, the qubit 12 is configured as a phase qubit. For example, the phase qubit 12 can be arranged as a Josephson junction embedded in a superconducting loop (e.g., an inductor). Thus, the "one" and "zero" quantum states of the phase qubit 12 can differ by the presence or absence of one flux quantum in the inductor of the phase qubit 12 (e.g., having a current difference of approximately 3 µA or less).

The RQL readout system 10 also includes an input stage 14, an output stage 16, and an RQL comparator 18. The input stage 14 is configured to propagate a read pulse RD_PLS that is provided to read the quantum state of the phase qubit 12, such as during a readout operation. As an example, the read pulse RD_PLS can be generated from an external circuit, such as the input stage 14 can include at least one input Josephson junction that can sequentially trigger to propagate the read pulse RD_PLS. Similarly, the output stage 16 is configured to propagate an output pulse OUT that is generated in response to the read pulse RD_PLS in a first quantum state of the phase qubit 12. For example, the output stage 16 can include at least one output Josephson junction that can sequentially trigger to propagate the output pulse OUT to indicate that the phase qubit 12 is in the first quantum state. Conversely, if the phase qubit 12 is in the second quantum state, no output pulse OUT is generated. Therefore, the output pulse OUT is not propagated at the output stage 16 in response to the read pulse RD_PLS when the phase qubit 12 is in the second quantum state.

The RQL comparator 18 is configured to determine the quantum state of the phase qubit 12 in response to the read pulse RD_PLS, and to generate the output pulse OUT if the phase qubit 12 is in the first quantum state. Therefore, the quantum state of the phase qubit 12 can be indicated to other quantum or classical circuits. For example, the output pulse OUT can be implemented for quantum error correction or a variety of other quantum or classical processing applications. In the example of FIG. 1, the phase qubit 12 is demonstrated as coupled to the RQL comparator 18 symmetrically, such that a bias current $I_Q$ can flow through the RQL comparator 18. The direction of the flow of the bias current $I_Q$ can be based on the quantum state of the phase qubit 12. For example, the phase qubit 12 can be inductively coupled to the RQL comparator 18, such that the bias current $I_Q$ can be magnetically induced to flow through the RQL comparator 18. As described herein, "inductive coupling" refers to magnetic coupling between respective inductors, such that a current flow through one inductor induces a current flow through the other inductor based on a magnetic field through a common core of the respective inductors.

In the example of FIG. 1, the RQL comparator 18 includes Josephson junctions 20 that can be arranged symmetrically with respect to the phase qubit 12. As an example, the RQL comparator 18 can include a first of the Josephson junctions 20 and a second of the Josephson junctions 20 through which the portions of the bias current $I_Q$ flow and which are each coupled to the output stage 16. The direction of the bias current $I_Q$ in the current loop can thus disproportionally affect a threshold of each of the first and second Josephson junctions 20 to selectively trigger one of the first and second Josephson junctions 20 in response to the read pulse RD_PLS. As a result, in the first quantum state of the phase qubit 12, the first Josephson junction can trigger to provide the output pulse OUT. As an example, the bias current $I_Q$ flowing through the first of the Josephson junctions 20 can be added to the read pulse RD_PLS to exceed the threshold of the first of the Josephson junctions 20, thus triggering the first of the Josephson junctions 20 to generate the output pulse OUT. Conversely, in the second quantum state of the phase qubit 12, the second Josephson junction can trigger to prevent the output pulse OUT from propagating on the output stage 16. As an example, the bias current $I_Q$ flowing through the first of the Josephson junctions 20 can be subtracted from the read pulse RD_PLS to not reach the threshold of the first of the Josephson junctions 20 to not trigger the first of the Josephson junctions 20, but instead triggering the second of the Josephson junctions 20, resulting in no generation of the output pulse OUT.

The RQL readout system 10 also includes an RQL clock 22 that is configured to generate an RQL clock signal CLK. As an example, the RQL clock signal CLK can be a four phase (e.g., quadrature) clock signal, such as having a very high frequency (e.g., tens of gigahertz). In the example of FIG. 1, the RQL clock signal CLK is demonstrated as being provided to the input stage 14, the output stage 16, and the RQL comparator 18. The read pulse RD_PLS, when combined with the RQL clock signal CLK, can exceed the thresholds of at least a portion of the input Josephson junctions in the input stage, the output Josephson junctions in the output stage, and the Josephson junctions 20 in the RQL comparator 18 to facilitate triggering of the respective Josephson junctions. For example, the read pulse can be provided at a first cycle (e.g., positive cycle) of the RQL clock signal CLK, and during a second cycle (e.g., negative cycle) of the RQL clock signal CLK, a negative pulse can be provided to reset the respective Josephson junctions. As an example, the RQL clock signal CLK can be provided to RQL comparator 18 in a common-mode connection, such that the Josephson junctions 20 are arranged symmetrically with respect to the RQL clock signal CLK. Therefore, based on the balanced connection of the RQL clock signal CLK in the input stage 14, the output stage 16, and the RQL comparator 18, the RQL clock signal CLK and associated shunt resistors do not imbalance the bias current $I_Q$. Additionally, because of the inductive coupling of the phase qubit 12 to the RQL comparator 18, the RQL clock signal CLK is effectively isolated from the phase qubit 12.

The RQL readout system 10 therefore provides a manner for reading the quantum state of the phase qubit 12 in a very rapid manner with substantially mitigated decoherence. Because the RQL readout system 10 implements RQL-based quantum logic, the RQL readout system 10 can be configured to provide readout of the quantum state of the phase qubit 12 at very rapid data rates (e.g., reading the quantum state in less than one nanosecond) with substantially minimal losses and generated heat (e.g., operating at temperatures of approximately 20 mK without causing local heating). Additionally, based on the balanced fabrication of the RQL comparator 18 with respect to the arrangement of the Josephson junctions 20 and the respective interaction with the bias current $I_Q$, the RQL readout system 10 can distinguish current amplitude changes of, for example, less than approximately 3 µA, and can thus achieve a very high sensitivity. Furthermore, based on the isolation of the phase qubit 12 from the RQL clock signal CLK and based on the balanced arrangement of the RQL clock signal CLK, the RQL readout system 10 can substantially mitigate decoherence of the quantum state of the phase qubit 12.

It is to be understood that the RQL readout system 10 is demonstrated simplistically, such that the RQL readout system 10 can include one or more circuit devices that interconnect and/or are included in the components of the RQL readout system 10. For example, as described herein, the term "coupled" can refer to electrical coupling through one or more circuit devices (e.g., an inductor) in the associated quantum circuit, such that current and/or current pulses can flow between coupled components through one or more inductors or other devices. Therefore, coupling between devices in the RQL readout system 10 can include coupling through inductors and/or other circuit devices.

Figure 2:
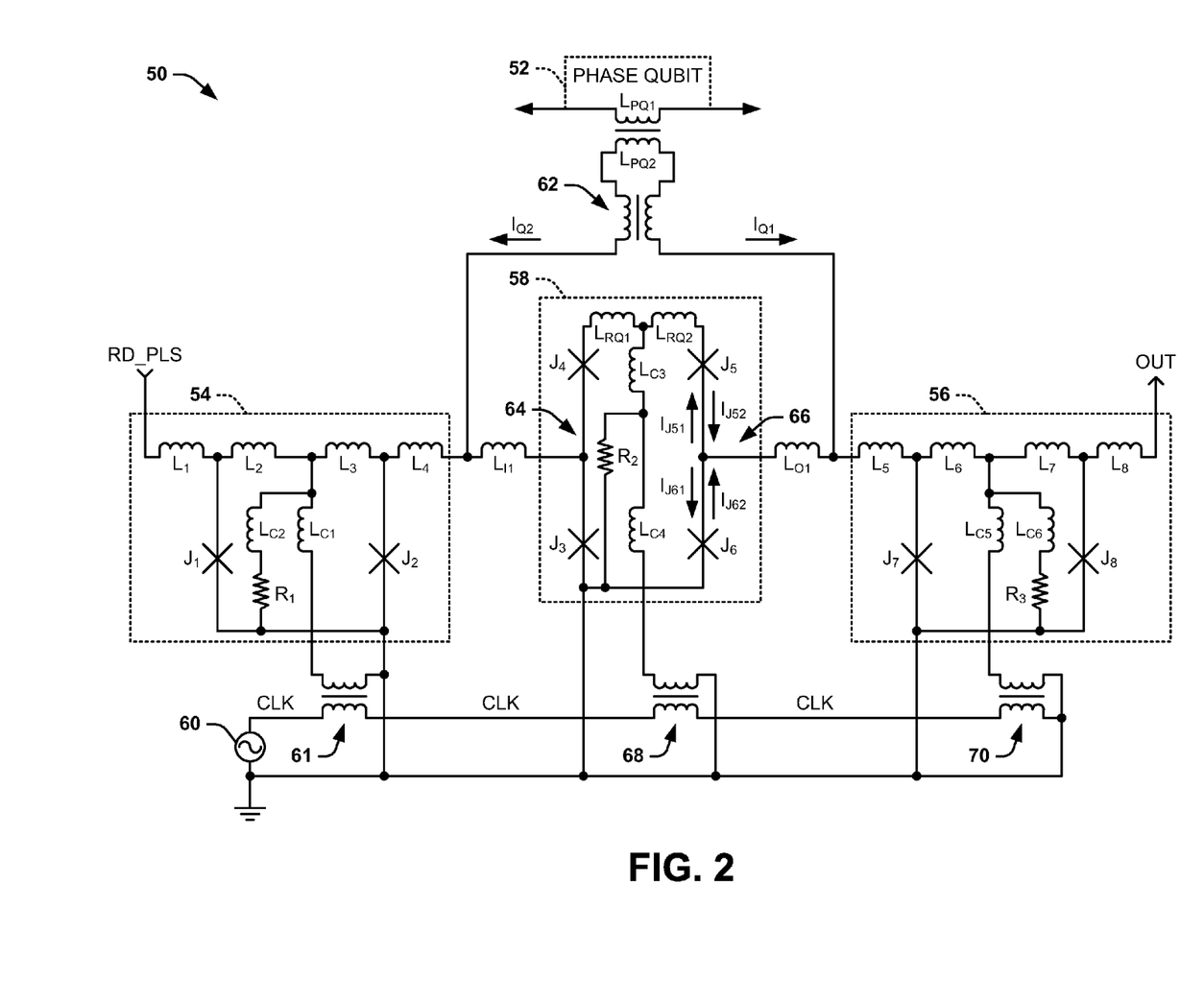
FIG. 2 illustrates an example of an RQL readout circuit.

FIG. 2 illustrates an example of an RQL readout circuit 50. The RQL readout circuit 50 can correspond to the RQL readout system 10 in the example of FIG. 1. Therefore, the RQL readout circuit 50 can be implemented in a variety of quantum and classical computing environments to read a quantum state from a phase qubit 52. As an example, at least a portion of the RQL readout circuit 50 can be implemented on an IC in a superconducting environment (e.g., at a very low temperature).

The RQL readout circuit 50 also includes an input stage 54, an output stage 56, and an RQL comparator 58. The input stage 54 is configured to propagate a read pulse RD_PLS that is provided to read the quantum state of the phase qubit 52, such as during a readout operation. As an example, the read pulse RD_PLS can be generated from an external circuit, such as the input stage 54 can include at least one input Josephson junction that can sequentially trigger to propagate the read pulse RD_PLS. The input stage 54 includes a set of inductors through which the read pulse RD_PLS is provided. In the example of FIG. 2, the input stage 54 includes a first inductor $L_1$, a second inductor $L_2$, a third inductor $L_3$, and a fourth inductor $L_4$. The input stage 54 also includes a first Josephson junction $J_1$ that is coupled to the first and second inductors $L_1$ and $L_2$ and to a low-voltage rail (e.g., ground), and includes a second Josephson junction $J_2$ that is coupled to the third and fourth inductors $L_3$ and $L_4$ and to the low-voltage rail.

The first and second Josephson junctions $J_1$ and $J_2$ are configured to sequentially trigger to propagate the read pulse RD_PLS along the input stage 54 via the second, third, and fourth inductors $L_2$, $L_3$, and $L_4$. In the example of FIG. 2, the RQL readout circuit 50 includes an RQL clock 60 that is configured to generate the RQL clock signal CLK that is provided to the input stage 54 between the second and third inductors $L_2$ and $L_3$ via an inductive coupling 61 (e.g., a transformer) and an inductor $L_{C1}$. The RQL clock signal CLK thus facilitates triggering of the first and second Josephson junctions $J_1$ and $J_2$. As an example, the read pulse RD_PLS can be provided substantially concurrently with a positive cycle of the RQL clock signal CLK, such that the first and second Josephson junctions $J_1$ and $J_2$ can have sufficient current to trigger in response to the read pulse RD_PLS. In the example of FIG. 2, the RQL clock signal CLK is shunted to ground via an inductor $L_{C2}$ and a resistor $R_1$. In the arrangement of the input stage 54, the resistor $R_1$ is also provided as a common shunting resistor for the first and second Josephson junctions $J_1$ and $J_2$. As a result, the inductor $L_3$ can provide additional inductive isolation of the resistor $R_1$ with respect to the phase qubit 52, such as to further mitigate the effects of resistor noise on the qubit coherence time of the phase qubit 52.

The RQL comparator 58 is configured to determine the quantum state of the phase qubit 52 in response to the read pulse RD_PLS, and to generate the output pulse OUT if the phase qubit 52 is in the first quantum state. In the example of FIG. 2, the inductor $L_{PQ1}$ of the phase qubit 52 is demonstrated as inductively coupled to an inductor $L_{PQ2}$ to induce the current $I_Q$ based on the quantum state of the phase qubit 52 through the inductor $L_{PQ2}$ and through a transformer 62 that is arranged as an inductive common-mode choke (e.g., to substantially mitigate an inductance acting upon the current $I_Q$). In the example of FIG. 2, the current $I_Q$ is demonstrated as currents $I_{Q1}$ and $I_{Q2}$ flowing in opposite directions. However, it is to be understood that the current $I_{Q1}$ and $I_{Q2}$ correspond to the current $I_Q$ flowing in opposite directions depending on the quantum state of the phase qubit 52. For example, the current $I_{Q1}$ can correspond to the current $I_Q$ flowing in a first direction based on the phase qubit 52 having a first quantum state, and the current $I_{Q2}$ can correspond to the current $I_Q$ flowing in a second direction based on the phase qubit 54 having a second quantum state. Therefore, the currents $I_{Q1}$ and $I_{Q2}$ are substantially equal in magnitude and direction based on the quantum state of the phase qubit 52.

The phase qubit 52 is inductively coupled to the RQL comparator 58 via the inductor $L_{PQ2}$, the transformer 62, an inductor $L_{I1}$ that is coupled to the input stage 54, and an inductor $L_{O1}$ that is coupled to the output stage 54. The RQL comparator 58 includes Josephson junctions $J_3$ and $J_4$ that are each coupled to the inductor $L_{I1}$ at a node 64, and Josephson junctions $J_5$ and $J_6$ that are each coupled to the inductor $L_{O1}$ at a node 66. The Josephson junctions $J_4$ and $J_5$ are coupled via inductors $L_{RQ1}$ and $L_{RQ2}$, and the Josephson junctions $J_3$ and $J_6$ are coupled to ground. Additionally, the RQL clock signal CLK is provided in a common-mode manner between the inductors $L_{RQ1}$ and $L_{RQ2}$ via an inductive coupling 68 (e.g., a transformer) and a pair of inductors $L_{C3}$ and $L_{C4}$, with a shunt resistor $R_2$ interconnecting the inductors $L_{C3}$ and $L_{C4}$ to ground. Therefore, the phase qubit 52 is symmetrically coupled to the RQL comparator 58, and the RQL comparator 58 is symmetric with respect to the circuit components therein. Similar to as described previously, the RQL clock signal CLK facilitates triggering of the Josephson junctions therein. As an example, the read pulse RD_PLS can be provided substantially concurrently with a positive cycle of the RQL clock signal CLK, such that the Josephson junction $J_3$ can propagate the read pulse RD_PLS to the Josephson junctions $J_5$ and $J_6$, and one of the Josephson junctions $J_5$ and $J_6$ can have sufficient current to trigger in response to the read pulse RD_PLS. In the example of FIG. 2, the resistor $R_2$ is symmetrically arranged with respect to the phase qubit 52 as a common shunt resistor with respect to the Josephson junctions $J_3$, $J_4$, $J_5$, and $J_6$, as opposed to typical superconducting circuit applications in which shunt resistors are provided in parallel with each respective Josephson junction of the given circuit. Accordingly, the symmetrical common shunt arrangement of the resistor $R_2$ substantially mitigates the presence of noise that could degrade a coherence time of the phase qubit 52.

As described previously, the direction of the flow of the bias current $I_Q$ can be based on the quantum state of the phase qubit 52, and thus flows through the inductor $L_{O1}$ and into the node 66 as the current $I_{Q1}$, or flows out from the node 66 and through inductor $L_{O1}$ as the current $I_{Q2}$. In the example of FIG. 2, the current $I_{Q1}$ is demonstrated as splitting at the node 66, with a first portion of the current $I_{Q1}$ (demonstrated as a current $I_{J51}$) flowing through the Josephson junction $J_5$ to the inductor $L_{RQ2}$ and a second portion of the current $I_{Q1}$ (demonstrated as a current $I_{J61}$) flowing through the Josephson junction $J_6$ to ground. Similarly, the current $I_{Q2}$ is demonstrated as joining at the node 66, with a first portion of the current $I_{Q2}$ (demonstrated as a current $I_{J52}$) flowing through the Josephson junction $J_5$ to the node 66 and a second portion of the current $I_{Q2}$ (demonstrated as a current $I_{J62}$) flowing through the Josephson junction $J_6$ to the node 66 from ground. Therefore, currents $I_{J51}$ and $I_{J61}$ correspond to the current $I_{Q1}$, and thus the first quantum state of the phase qubit 52, and the currents $I_{J52}$ and $I_{J62}$ correspond to the current $I_{Q2}$, and thus the second quantum state of the phase qubit 52. Accordingly, the currents $I_{J51}$ and $I_{J61}$ and the currents $I_{J52}$ and $I_{J62}$ change the relative threshold of the Josephson junctions $J_5$ and $J_6$ with respect to the read pulse RD_PLS.

During a read operation, the read pulse RD_PLS propagates through the input stage 54 (e.g., through the inductors $L_1$, $L_2$, $L_3$, and $L_4$ via the Josephson junctions $J_1$ and $J_2$) and through the inductor $L_{I1}$ to trigger the Josephson junction $J_3$. The read pulse RD_PLS thus gets propagated through inductors $L_{RQ1}$ and $L_{RQ2}$ to the Josephson junctions $J_5$ and $J_6$. Thus, the bias current $I_Q$ is either added to or subtracted from the read pulse RD_PLS with respect to Josephson junctions $J_5$ and $J_6$ based on the quantum state of the phase qubit 52.

For example, in the first quantum state of the phase qubit 52, the current $I_{Q1}$ flows into the node 66, and thus the current $I_{J51}$ flows from the node 66 through the Josephson junction $J_5$ and the current $I_{J61}$ flows from the node 66 through the Josephson junction $J_6$. Because the current $I_{J51}$ flows oppositely with respect to the read pulse RD_PLS propagated from the Josephson junction $J_3$ and through the inductors $L_{RQ1}$ and $L_{RQ2}$, the current $I_{J51}$ is subtracted from the read pulse RD_PLS (e.g., increases the threshold of the Josephson junction $J_5$). Thus, Josephson junction $J_5$ does not trigger in the first quantum state of the phase qubit 52. However, because the current $I_{J61}$ flows in the same direction as the read pulse RD_PLS propagated from the Josephson junction $J_3$ and through the inductors $L_{RQ1}$ and $L_{RQ2}$, the current $I_{J61}$ is added to the read pulse RD_PLS (e.g., decreases the threshold of the Josephson junction $J_6$). Thus, Josephson junction $J_6$ triggers in the first quantum state of the phase qubit 52.

As another example, in the second quantum state of the phase qubit 52, the current $I_{Q2}$ flows from the node 66, and thus the current $I_{J52}$ flows into the node 66 through the Josephson junction $J_5$ and the current $I_{J62}$ flows into the node 66 through the Josephson junction $J_6$. Because the current $I_{J52}$ flows in the same direction as the read pulse RD_PLS propagated from the Josephson junction $J_3$ and through the inductors $L_{RQ1}$ and $L_{RQ2}$, the current $I_{J52}$ is added to the read pulse RD_PLS (e.g., decreases the threshold of the Josephson junction $J_5$). Thus, Josephson junction $J_5$ triggers in the second quantum state of the phase qubit 52. However, because the current $I_{J62}$ flows in the opposite direction as the read pulse RD_PLS propagated from the Josephson junction $J_3$ and through the inductors $L_{RQ1}$ and $L_{RQ2}$, the current $I_{J62}$ is subtracted from the read pulse RD_PLS (e.g., increases the threshold of the Josephson junction $J_6$). Thus, Josephson junction $J_6$ does not trigger in the second quantum state of the phase qubit 52.

The output stage 56 is configured to propagate the output pulse OUT that is generated in response to the triggering of the Josephson junction $J_6$, and thus in the first quantum state of the phase qubit 52. The output stage 56 is demonstrated in the example of FIG. 2 as being arranged substantially similar (e.g., symmetrical) with respect to the input stage 54. In the example of FIG. 2, the output stage 56 includes a set of inductors through which the output pulse OUT propagates from the Josephson junction $J_6$ and through the inductor $L_{O1}$. In the example of FIG. 2, the output stage 56 includes a first inductor $L_5$, a second inductor $L_6$, a third inductor $L_7$, and a fourth inductor $L_8$. The output stage 56 also includes a first Josephson junction $J_7$ that is coupled to the third and fourth inductors $L_7$ and $L_8$ and to ground, and includes a second Josephson junction $J_8$ that is coupled to the first and second inductors $L_5$ and $L_6$ and to ground. The first and second Josephson junctions $J_7$ and $J_8$ are configured to sequentially trigger to propagate the output pulse OUT along the output stage 56 via the second, third, and fourth inductors $L_6$, $L_7$, and $L_8$. In the example of FIG. 2, the RQL clock signal CLK is provided to the output stage 56 between the second and third inductors $L_6$ and $L_7$ via an inductive coupling 70 (e.g., a transformer) and an inductor $L_{C5}$, and is shunted to ground via an inductor $L_{C6}$ and a resistor $R_3$. In the arrangement of the output stage 56, the resistor $R_3$ is also provided as a common shunting resistor for the first and second Josephson junctions $J_7$ and $J_8$. As a result, the inductor $L_6$ can provide additional inductive isolation of the resistor $R_3$ with respect to the phase qubit 52, such as to further mitigate the effects of resistor noise on the qubit coherence time of the phase qubit 52.

The RQL clock signal CLK thus facilitates triggering of the first and second Josephson junctions $J_7$ and $J_8$. Accordingly, in response to the triggering of the Josephson junction $J_6$ in response to the read pulse RD_PLS in the first quantum state of the phase qubit 52, the output pulse OUT is provided at the output stage 56 to indicate the first quantum state of the phase qubit 52. Conversely, in response to the triggering of the Josephson junction $J_5$ instead of the Josephson junction $J_6$ in response to the read pulse RD_PLS in the second quantum state of the phase qubit 52, the output pulse OUT is not provided at the output stage 56 to indicate the second quantum state of the phase qubit 52.

It is to be understood that the RQL readout circuit 50 is not limited to the example of FIG. 2. As an example, the input stage 54 and the output stage 56 are not limited to as demonstrated in the example of FIG. 2, but can include additional circuit components, such as one or more additional Josephson junctions and/or one or more additional inductors. Additionally, the readout operation described herein is not limited to readout of a phase qubit 52, but a variety of other qubits or circuit devices having logic or quantum states that are based on a current flow direction can be implemented in the RQL readout circuit 50. Accordingly, the RQL readout circuit 50 can be configured in a variety of ways.

Figure 3:
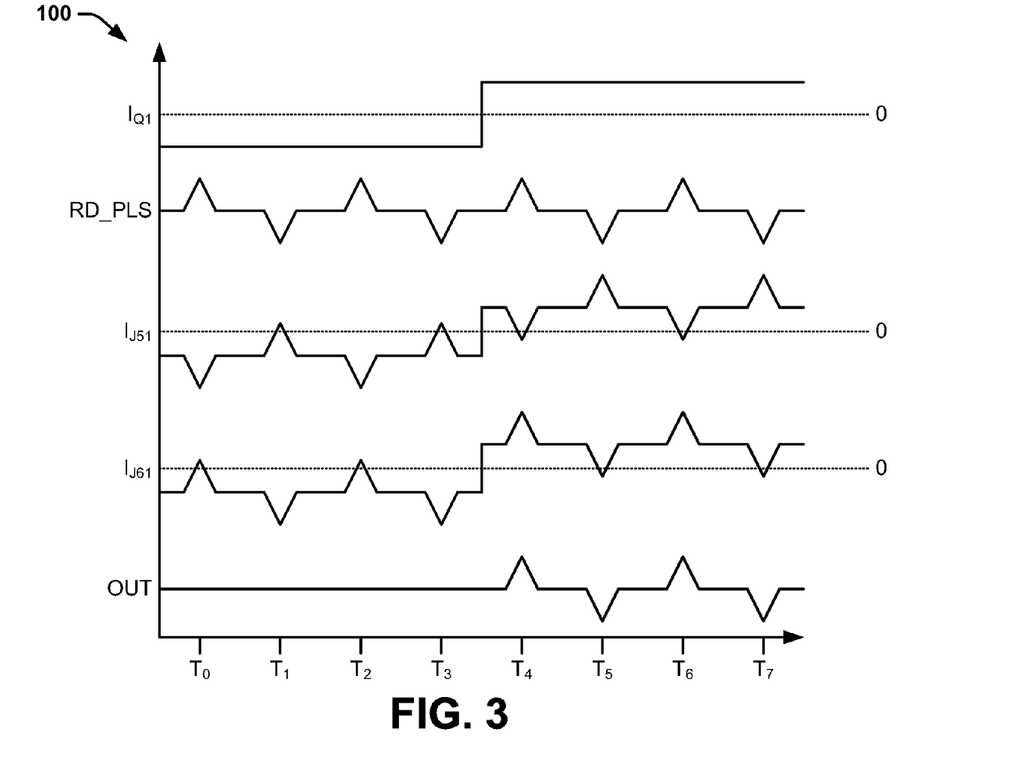
FIG. 3 illustrates an example of a timing diagram.

FIG. 3 illustrates an example of a timing diagram 100. The timing diagram 100 can correspond to the timing of the RQL readout circuit 50. Therefore, reference is to be made to the example of FIG. 2 in the following description of the example of FIG. 3. The timing diagram 100 demonstrates the current $I_{Q1}$, such that a positive magnitude of the current $I_{Q1}$ demonstrates that the current $I_Q$ is provided as the current $I_{Q1}$ in the first quantum state of the phase qubit 52 and a negative magnitude of the current $I_{Q1}$ demonstrates that the current $I_Q$ is provided as the current $I_{Q2}$ in the second quantum state of the phase qubit 52. The timing diagram 100 also demonstrates the read pulse RD_PLS, the current $I_{J51}$, the current $I_{J61}$, and the output pulse OUT. The current $I_{J51}$ is demonstrated as having a negative magnitude when the current $I_Q$ is provided as the current $I_{Q2}$ in the second quantum state, and is demonstrated as having a positive magnitude to correspond to the current $I_{J52}$ when the current $I_Q$ is provided as the current $I_{Q1}$ in the first quantum state. Similarly, the current $I_{J61}$ is likewise demonstrated as having a negative magnitude when the current $I_Q$ is provided as the current $I_{Q1}$ in the second quantum state, and is demonstrated as having a positive magnitude to correspond to the current $I_{J62}$ when the current $I_Q$ is provided as the current $I_{Q2}$ in the first quantum state.

At a time $T_0$, the current $I_{Q1}$ is negative, such that the phase qubit 52 is in the second quantum state. The read pulse RD_PLS is provided at the input stage 54, such as concurrently with a positive cycle of the RQL clock signal CLK. The current $I_{J51}$ is negative at the time $T_0$, and thus is added to the read pulse RD_PLS with respect to the Josephson junction $J_5$. The current $I_{J61}$ is also negative, and thus is subtracted from the read pulse RD_PLS with respect to the Josephson junction $J_6$. Therefore, the Josephson junction $J_5$ triggers, and the Josephson junction $J_6$ does not trigger. As a result, the output pulse OUT is not generated and propagated along the output stage 56. Accordingly, the output stage 56 indicates that the phase qubit 52 is in the second quantum state. At a time $T_1$, the read pulse RD_PLS is provided as a negative pulse, such as substantially concurrently with a negative cycle of the RQL clock signal CLK, to reset the Josephson junctions of the RQL readout circuit 50. At a time $T_2$, the read pulse RD_PLS is provided again, resulting in an indication of the phase qubit 52 being in the second quantum state again, similar to as described previously. At a time $T_3$, the read pulse RD_PLS is again provided as a negative pulse to reset the Josephson junctions of the RQL readout circuit 50.

At a time $T_4$, the current $I_{Q1}$ is positive, such that the phase qubit 52 is in the first quantum state. The read pulse RD_PLS is provided at the input stage 54, the current $I_{J51}$ is positive, and thus is subtracted from the read pulse RD_PLS with respect to the Josephson junction $J_5$. The current $I_{J61}$ is likewise positive, and thus is added to the read pulse RD_PLS with respect to the Josephson junction $J_6$. Therefore, the Josephson junction $J_5$ does not trigger, and the Josephson junction $J_6$ triggers. As a result, the output pulse OUT is generated and propagates along the output stage 56. Accordingly, the output stage 56 indicates that the phase qubit 52 is in the first quantum state. At a time $T_5$, the read pulse RD_PLS is provided as a negative pulse to reset the Josephson junctions of the RQL readout circuit 50. At a time $T_6$, the read pulse RD_PLS is provided again, resulting in an indication of the phase qubit 52 being in the first quantum state again, similar to as described previously. At a time $T_7$, the read pulse RD_PLS is again provided as a negative pulse to reset the Josephson junctions of the RQL readout circuit 50.

Figure 4:
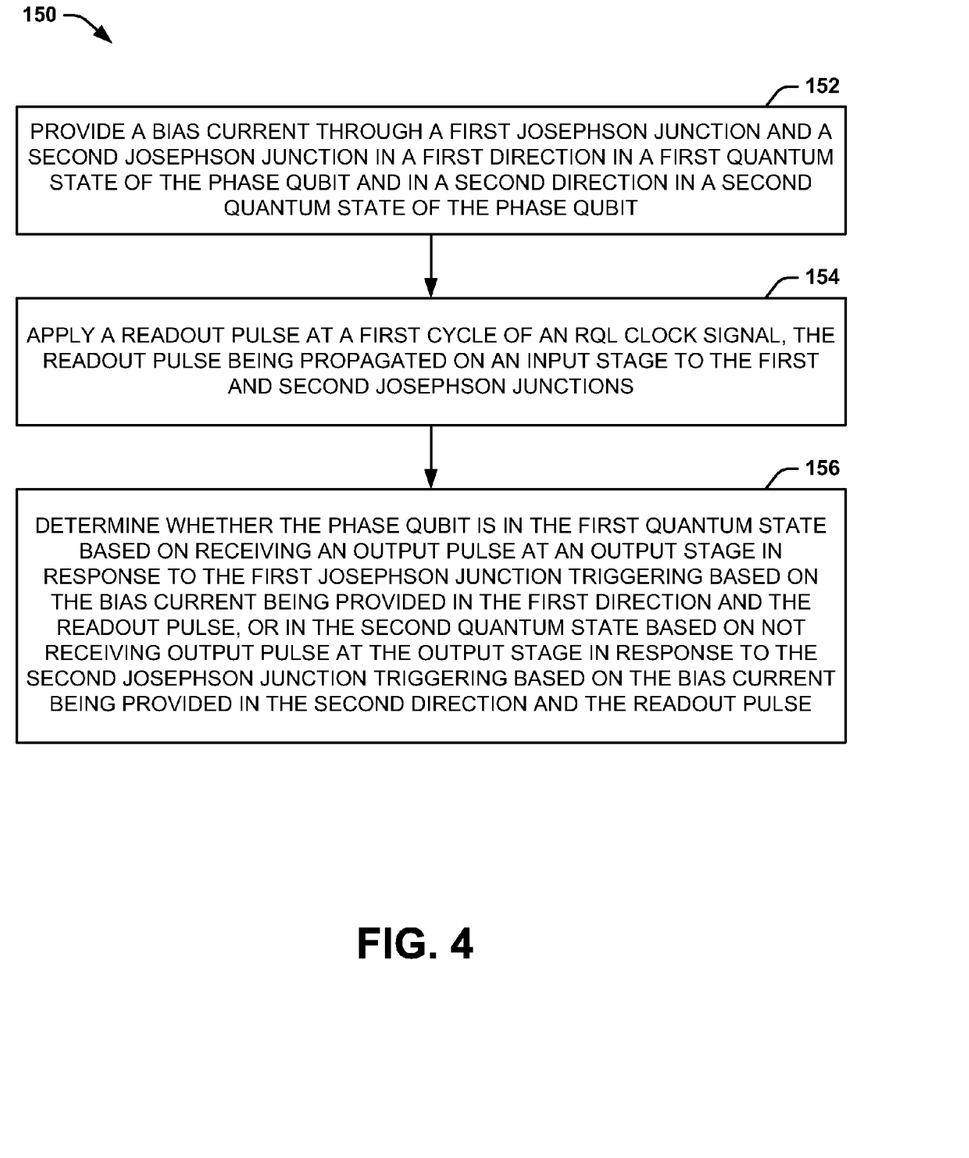
FIG. 4 illustrates an example of a method for reading a quantum state of a phase qubit.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for reading a quantum state of a phase qubit (e.g., the phase qubit 12). At 152, a bias current (e.g., the bias current $I_Q$) is provided through a first Josephson junction (e.g., the Josephson junction $J_6$) and a second Josephson junction (e.g., the Josephson junction $J_5$) in a first direction (e.g., the bias current $I_{Q1}$) in a first quantum state of the phase qubit and in a second direction (e.g., the bias current $I_{Q2}$) in a second quantum state of the phase qubit. At 154, a read pulse (e.g., the read pulse RD_PLS) is applied at a first cycle of an RQL clock signal (e.g., the RQL clock signal CLK), the read pulse being propagated on an input stage (e.g., the input stage 14) to the first and second Josephson junctions. At 156, the phase qubit is determined to be in the first quantum state based on receiving an output pulse (e.g., the output pulse OUT) at an output stage (e.g., the output stage 16) in response to the read pulse the first Josephson junction triggering based on the bias current being provided in the first direction and the read pulse, or in the second quantum state based on not receiving output pulse at the output stage in response to the second Josephson junction triggering based on the bias current being provided in the second direction and the read pulse.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A reciprocal quantum logic (RQL) readout system comprising:
   an input stage on which a read pulse is provided;
   an output stage configured to propagate an output pulse; and
   an RQL comparator comprising a first Josephson junction and a second Josephson junction that are coupled to a qubit, such that a bias current switches between a first Josephson junction in a first quantum state of the qubit and a second Josephson junction in a second quantum state of the qubit, such that the first Josephson junction triggers to provide the output pulse on the output stage in the first quantum state in response to the read pulse and the second Josephson junction triggers to provide no output pulse on the output stage in the second quantum state in response to the read pulse.

2. The system of claim 1, further comprising an RQL clock configured to generate an RQL clock signal, wherein the read pulse is provided on a first cycle of the RQL clock signal and a negative pulse is provided on a second cycle of the RQL clock signal.

3. The system of claim 2, wherein the RQL clock is configured to provide the RQL clock signal to the input stage to facilitate triggering of at least one input Josephson junction to propagate the read pulse, to provide the RQL clock signal to the output stage to facilitate triggering of at least one output Josephson junction to propagate the output pulse in response to the read pulse in the first quantum state of the qubit, and to provide the RQL clock signal to the RQL comparator to facilitate triggering of one of the first and second Josephson junctions based on the respective one of the first and second quantum states of the qubit.

4. The system of claim 2, wherein the RQL clock signal is provided to the input stage, the output stage, and the RQL comparator in a symmetrical manner, and wherein the qubit is substantially isolated from the RQL clock signal via at least one inductive coupling.

5. The system of claim 1, wherein the qubit is inductively coupled to the RQL comparator to generate the bias current that flows through each of the first and second Josephson junctions in a first direction in the first quantum state and in a second direction in the second quantum state, the bias current being provided to change a relative threshold associated with each of the first and second Josephson junctions with respect to the read pulse.

6. The system of claim 5, wherein the bias current through the first Josephson junction in the first direction is added to the read pulse to trigger the first Josephson junction to generate the output pulse and the bias current through the second Josephson junction in the first direction is subtracted from the read pulse to prevent the second Josephson junction from triggering, and wherein the bias current through the first Josephson junction in the second direction is subtracted from the read pulse to prevent triggering of the first Josephson junction and the bias current through the second Josephson junction in the second direction is added to the read pulse to trigger the second Josephson junction.

7. The system of claim 1, wherein the RQL comparator further comprises a third Josephson junction and a fourth Josephson junction, wherein the first and second Josephson junctions are coupled to the output stage and wherein the third and fourth Josephson junctions are coupled to the input stage to substantially balance the RQL comparator, and wherein the qubit is inductively coupled to the input stage and to the output stage to generate the bias current through the first, second, third, and fourth Josephson junctions in a first direction in the first quantum state and in a second direction in the second quantum state.

8. The system of claim 7, further comprising an RQL clock configured to generate an RQL clock signal that is provided symmetrically with respect to the first and second Josephson junctions and the third and fourth Josephson junctions, wherein the read pulse is substantially synchronized with a first cycle of the RQL clock signal.

9. The system of claim 1, wherein the RQL comparator comprises a shunt resistor that symmetrically interconnects an RQL clock signal and the RQL comparator, such that the shunt resistor is symmetrically arranged with respect to the qubit.

10. The system of claim 1, wherein the qubit is a phase qubit.

11. A method for reading a quantum state of a phase qubit, the method comprising:
providing a bias current through a first Josephson junction and a second Josephson junction in a first direction in a first quantum state of the phase qubit and in a second direction in a second quantum state of the phase qubit;
applying a read pulse at a first cycle of an RQL clock signal, the read pulse being propagated on an input stage to the first and second Josephson junctions;
determining whether the phase qubit is in the first quantum state based on receiving an output pulse at an output stage in response to the first Josephson junction triggering based on the bias current being provided in the first direction and the read pulse, or in the second quantum state based on not receiving output pulse at the output stage in response to the second Josephson junction triggering based on the bias current being provided in the second direction and the read pulse.

12. The method of claim 11, further comprising:
providing the RQL clock signal to the input stage to facilitate triggering of at least one input Josephson junction to propagate the read pulse;
providing the RQL clock signal to the output stage to facilitate triggering of at least one output Josephson junction to propagate the output pulse in response to the read pulse in the first quantum state of the qubit; and
providing the RQL clock signal to the RQL comparator to facilitate triggering of one of the first and second Josephson junctions based on the respective one of the first and second quantum states of the qubit.

13. The method of claim 11, wherein providing the bias current comprises providing the bias current based on an inductive coupling of the phase qubit to the first and second Josephson junctions.

14. The method of claim 11, wherein providing the bias current comprises:
providing the bias current in the first direction to decrease a threshold of the first Josephson junction relative to the second Josephson junction; and
providing the bias current in the second direction to decrease a threshold of the second Josephson junction relative to the first Josephson junction.

15. The method of claim 11, wherein providing the bias current comprises:
adding the bias current in the first direction through the first Josephson junction to the read pulse to trigger the first Josephson junction to generate the output pulse at the output stage; and
subtracting the bias current in the second direction through the first Josephson junction from the read pulse to substantially prevent triggering of the first Josephson junction.

16. A reciprocal quantum logic (RQL) readout system comprising:
an RQL clock configured to generate an RQL clock signal;
an input stage along which a read pulse is propagated via at least one input Josephson junction, the read pulse being provided on a first cycle of the RQL clock signal;
an output stage configured to propagate an output pulse via at least one output Josephson junction during the first cycle of the RQL clock signal; and
an RQL comparator comprising a first Josephson junction and a second Josephson junction that are inductively coupled to a phase qubit and a shunt resistor that is arranged symmetrically with respect to the RQL comparator and the phase qubit, wherein a relative threshold associated with each of the first and second Josephson junctions changes in a first quantum state of the phase qubit relative to a second quantum state of the phase qubit to provide the output pulse on the output stage in the first quantum state in response to the read pulse and to provide no output pulse on the output stage in the second quantum state in response to the read pulse.

17. The system of claim 16, wherein the phase qubit generates a bias current that includes the first and second Josephson junctions in a first direction in the first quantum state and in a second direction in the second quantum state, the bias current being provided to change the relative threshold associated with each of the first and second Josephson junctions.

18. The system of claim 17, wherein the bias current through the first Josephson junction in the first direction is added to the read pulse to trigger the first Josephson junction to generate the output pulse and the bias current through the second Josephson junction in the first direction is subtracted from the read pulse to prevent the second Josephson junction from triggering, and wherein the bias current through the first Josephson junction in the second direction is subtracted from the read pulse to prevent triggering of the first Josephson junction and the bias current through the second Josephson junction in the second direction is added to the read pulse to trigger the second Josephson junction.

19. The system of claim 16, wherein the RQL comparator further comprises a third Josephson junction and a fourth Josephson junction, wherein the first and second Josephson junctions are coupled to the output stage and wherein the third and fourth Josephson junctions are coupled to the input stage.

20. The system of claim 16, wherein the RQL clock signal is provided symmetrically with respect to the phase qubit, wherein the read pulse is substantially synchronized with the first cycle of the RQL clock signal.

* * * * *